(12) United States Patent
Lee et al.

(10) Patent No.: US 12,553,138 B2
(45) Date of Patent: Feb. 17, 2026

(54) APPARATUS AND METHOD OF PROCESSING SUBSTRATE

(71) Applicant: SEMES CO., LTD., Chungcheongnam-do (KR)

(72) Inventors: Jee Young Lee, Chungcheongnam-do (KR); Won Geun Kim, Chungcheongnam-do (KR); Young Dae Chung, Chungcheongnam-do (KR); Ji Hoon Jeong, Chungcheongnam-do (KR); Tae Shin Kim, Chungcheongnam-do (KR); Won Sik Son, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 254 days.

(21) Appl. No.: 18/108,002

(22) Filed: Feb. 9, 2023

(65) Prior Publication Data
US 2024/0035166 A1    Feb. 1, 2024

(30) Foreign Application Priority Data

Jul. 29, 2022  (KR) .......................... 10-2022-0094651

(51) Int. Cl.
*C23F 1/00* (2006.01)

(52) U.S. Cl.
CPC ..................... *C23F 1/00* (2013.01)

(58) Field of Classification Search
CPC ............... C23F 1/00; H01L 21/67115; H01L 21/67248; H01L 21/67253; H01L 21/31111; H01L 21/6708; H01L 21/67086; H01L 21/67098; H01L 21/6715; H01L 21/67242; H01L 21/68785; H01L 21/68792; H01L 21/0206; H01L 21/67051
See application file for complete search history.

(56) References Cited

U.S. PATENT DOCUMENTS 9,899,229 B2 *  2/2018  Hinode ............... H01L 21/6708
11,430,662 B2 *  8/2022  Hidaka ............ H01L 21/67161
(Continued)

FOREIGN PATENT DOCUMENTS

CN            1452018 A  * 10/2003  ......... G01B 11/0625
KR    10-2015-0029563     3/2015
(Continued)

OTHER PUBLICATIONS

CN-1452018-A, Machine Translation. (Year: 2025).*
Office Action dated Apr. 24, 2024 in Korean Patent Application No. 10-2022-0094651, and its English machine translation by Global Dossier.
Office Action dated Dec. 26, 2024 for Korean Patent Application No. 10-2022-0094651 and its English translation from Global Dossier.

*Primary Examiner* — Duy Vu N Deo
*Assistant Examiner* — Christopher Remavege
(74) *Attorney, Agent, or Firm* — WOMBLE BOND DICKINSON (US) LLP

(57) ABSTRACT

A method of processing a substrate includes an etchant supplying operation of supplying an etchant to a substrate; a puddle operation of, by rotating the substrate at a first rotational speed, forming a liquid film of the etchant supplied to the substrate in a puddle shape; and a thickness adjusting operation of changing a rotational speed of the substrate to a rotational speed different from the first rotational speed to adjust a thickness of the liquid film of the etchant. Using the method, dispersion of the etching rate may be effectively controlled.

13 Claims, 7 Drawing Sheets

(56) References Cited

U.S. PATENT DOCUMENTS

| | | | |
|---|---|---|---|
| 2004/0004724 A1* | 1/2004 | Kim | G01B 11/0625 356/504 |
| 2013/0224956 A1* | 8/2013 | Negoro | H01L 21/31111 438/782 |
| 2014/0231013 A1* | 8/2014 | Hinode | H01L 21/67051 156/345.23 |
| 2015/0072078 A1* | 3/2015 | Negoro | H01L 21/67028 427/346 |
| 2015/0279708 A1* | 10/2015 | Kobayashi | H01L 21/67028 438/747 |
| 2016/0071746 A1 | 3/2016 | Hayashi | |
| 2016/0300727 A1* | 10/2016 | Hinode | H01L 21/67051 |
| 2018/0047559 A1* | 2/2018 | Kamiya | H01L 21/67051 |
| 2020/0251358 A1 | 8/2020 | Cha et al. | |
| 2021/0178522 A1 | 6/2021 | Kim et al. | |
| 2021/0183660 A1* | 6/2021 | Goh | H01L 22/26 |
| 2022/0020611 A1* | 1/2022 | Tachibana | B08B 3/08 |
| 2022/0310417 A1* | 9/2022 | Nakamura | H01L 21/67051 |

FOREIGN PATENT DOCUMENTS

| | | |
|---|---|---|
| KR | 10-2015-0119186 | 10/2015 |
| KR | 10-2018-0124200 A | 11/2018 |
| KR | 10-2020-0095818 | 8/2020 |
| KR | 10-2021-0075562 | 6/2021 |
| KR | 10-2022-0008763 A | 1/2022 |

* cited by examiner

[FIG. 1]
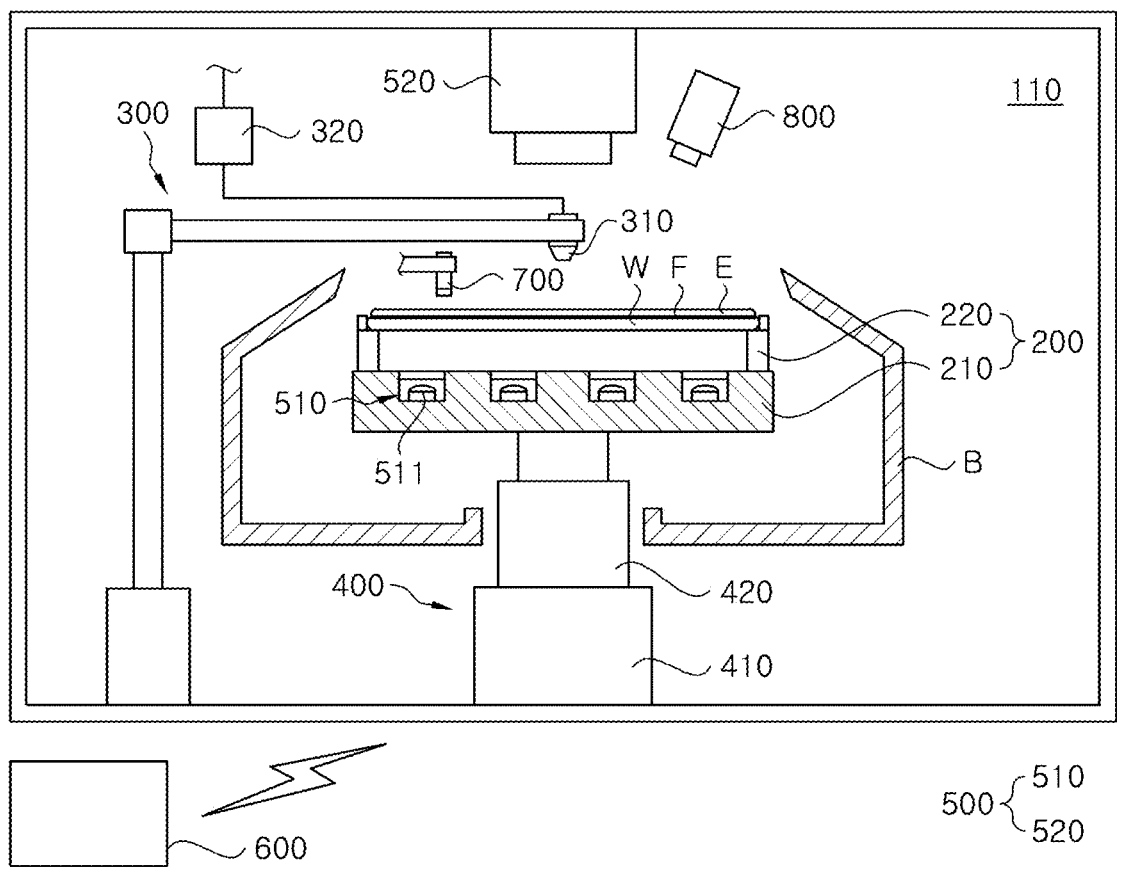

[FIG. 2]
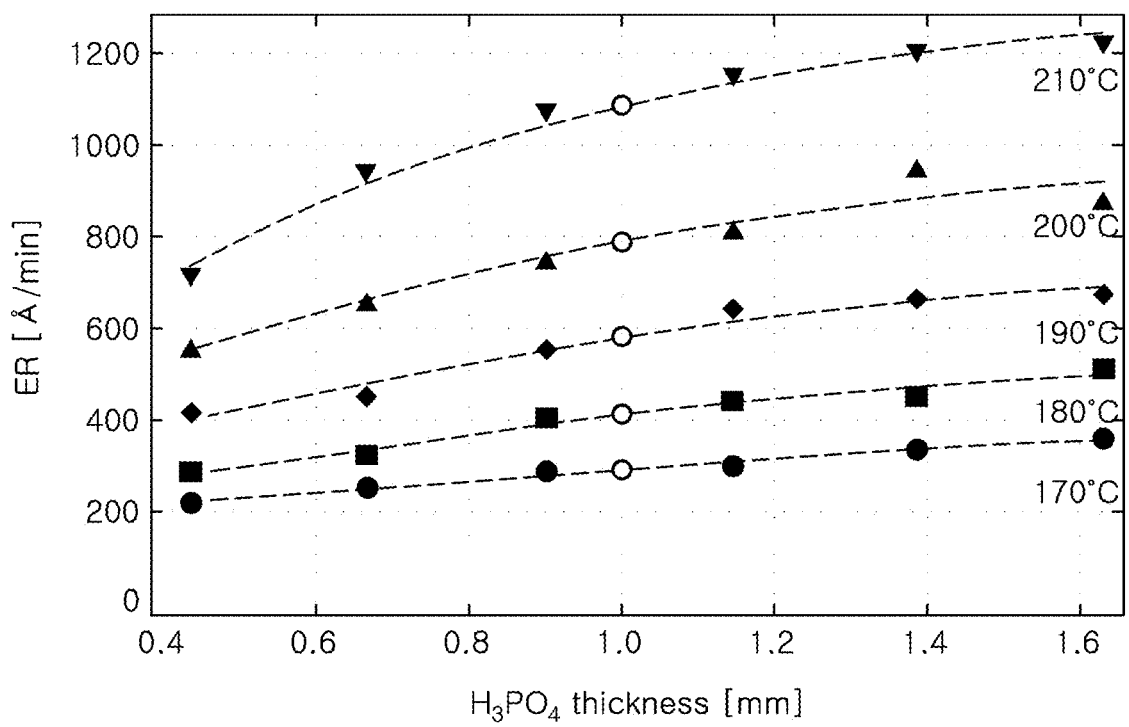
[FIG. 3]
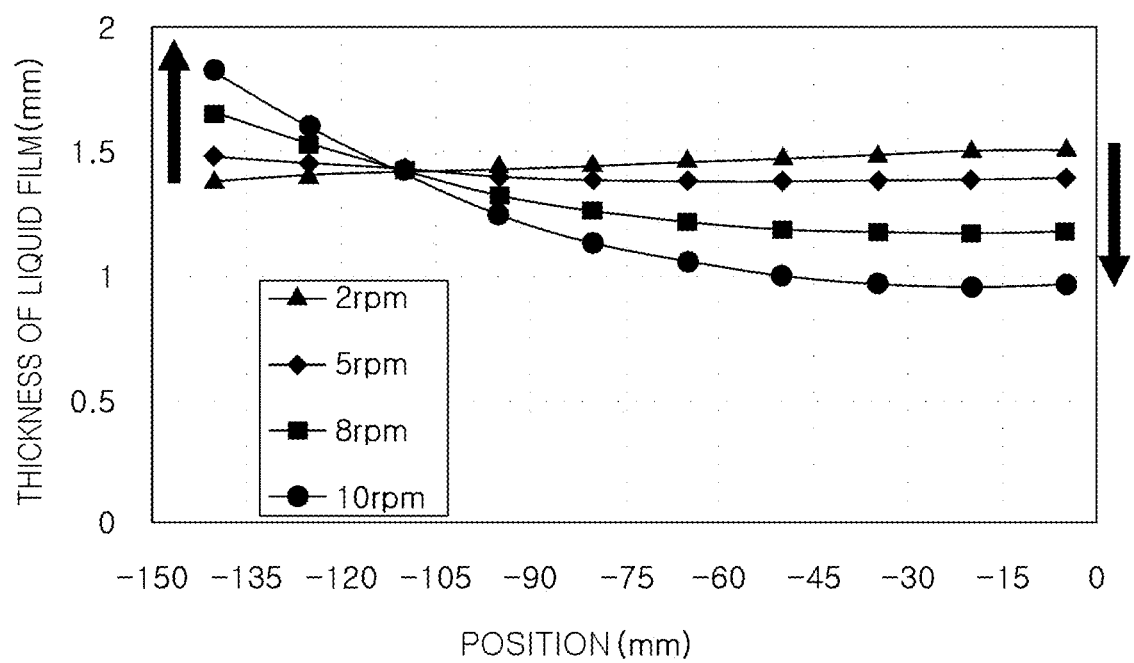

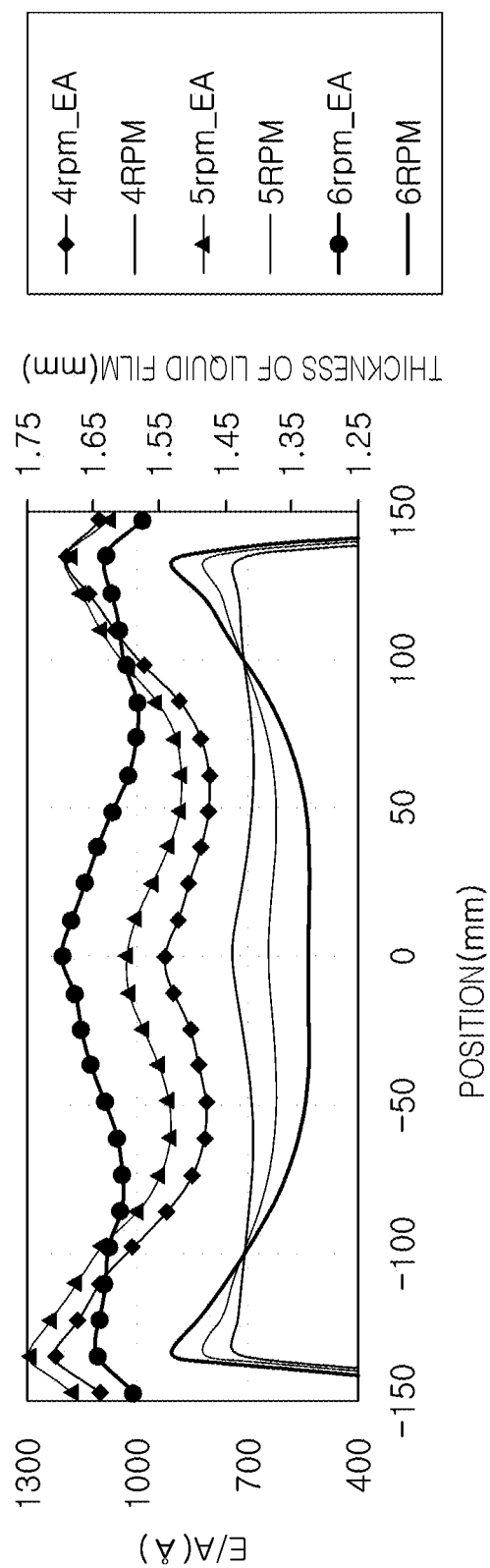
[FIG. 4]

[FIG. 5]
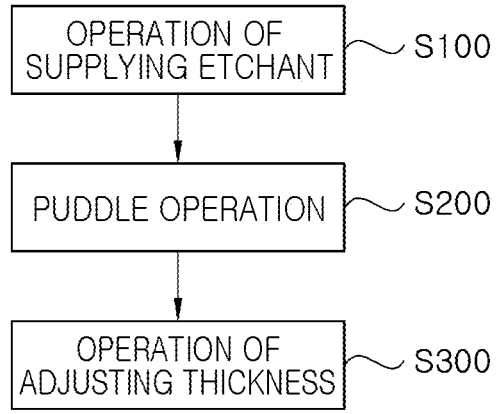
[FIG. 6]
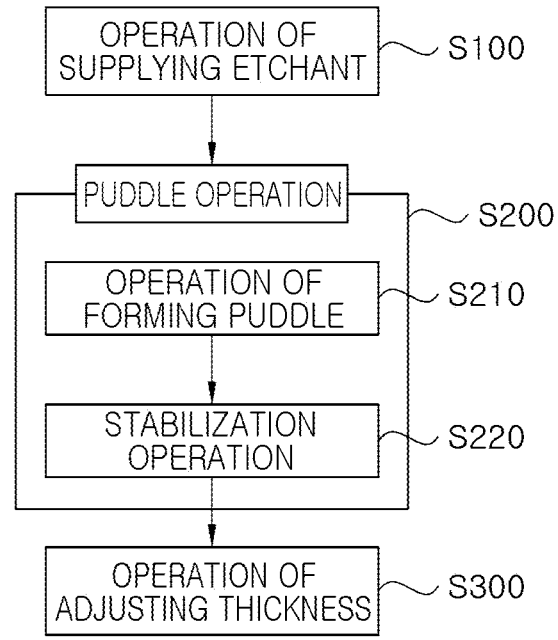

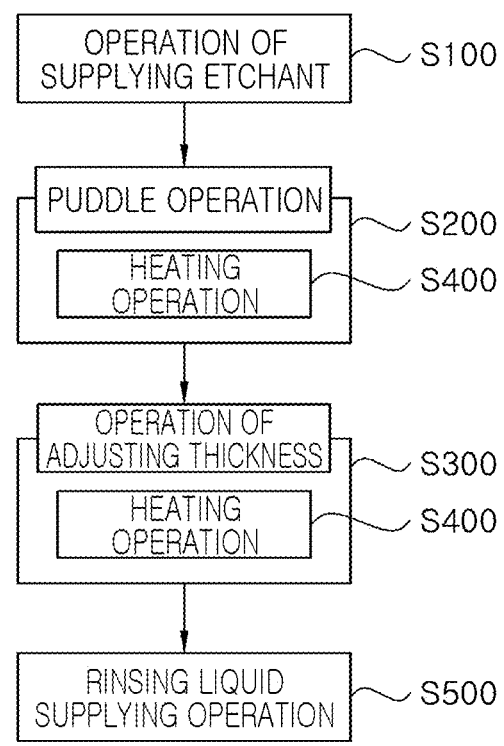
[FIG. 7]

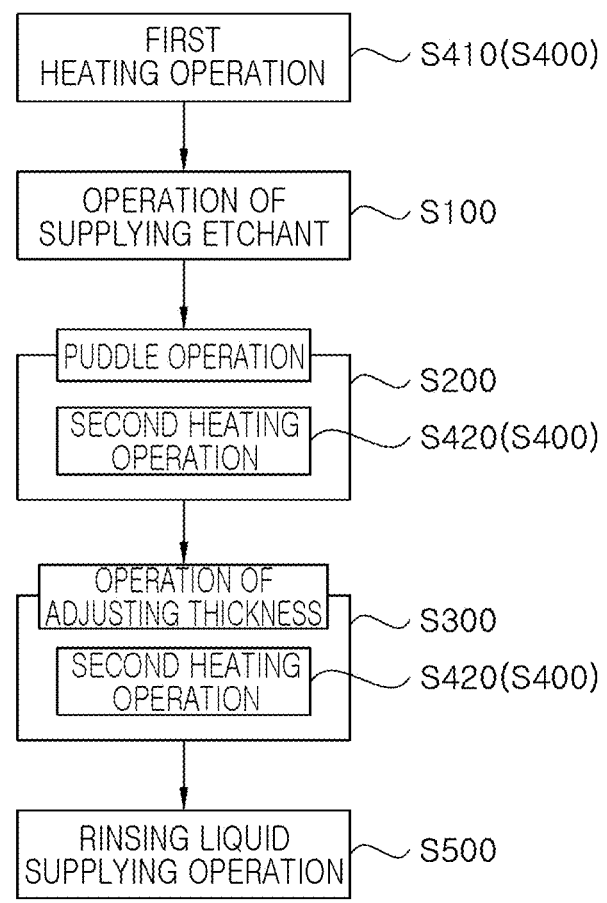

[FIG. 9]
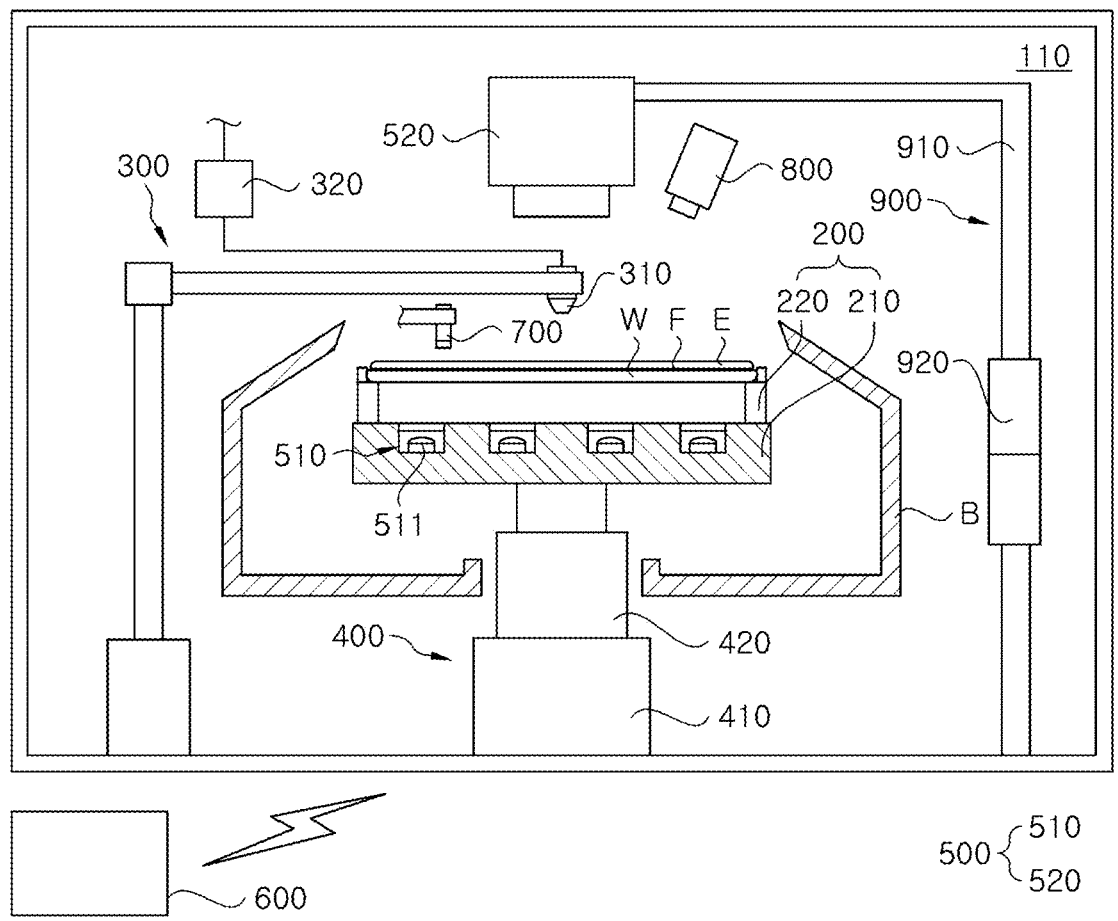

APPARATUS AND METHOD OF PROCESSING SUBSTRATE

CROSS-REFERENCE TO RELATED APPLICATIONS

The application claims benefit of priority to Korean Patent Application No. 10-2022-0094651 filed on Jul. 29, 2022 in the Korean Intellectual Property Office, the disclosure of which is incorporated herein by reference in its entirety.

BACKGROUND

1. Field

Example embodiments of the present disclosure relate to an apparatus and a method of processing a substrate.

2. Description of Related Art

Generally, when a substrate is etched in a single-wafer method in an etching process of patterning or removing a thin film formed on a substrate during a process of manufacturing a semiconductor, an etchant may be supplied to the substrate while the substrate may be rotated, and the thin film may be removed through a reaction between the thin film on the substrate and the etchant, and after the reaction, the produced by-products and remaining etchant may be removed from the substrate by rotation of the substrate.

In the etching process, a method of supplying a high-temperature-treated etchant to the substrate or heating the substrate may be applied to increase a rate of reaction between the thin film on the substrate and the etchant. In the method of heating the substrate, since the substrate may be heated while supplying the etchant, when there is a temperature difference between the etchant and the substrate, energy consumption required for uniform heating and heating may be increased, such that heating efficiency may decrease, and accordingly, etching efficiency may decrease, which may be problematic. Also, in the etching process, demand for a degree of etching may be different in different positions on the substrate if desired, but there may be a difficulty in addressing the issue.

SUMMARY

An example embodiment of the present disclosure is to provide an apparatus and a method of processing a substrate which may effectively control dispersion of an etching rate.

According to an example embodiment of the present disclosure, a method of processing a substrate includes an etchant supplying operation of supplying an etchant to a substrate; a puddle operation of, by rotating the substrate at a first rotational speed, forming a liquid film of the etchant supplied to the substrate in a puddle shape; and a thickness adjusting operation of changing a rotational speed of the substrate to a rotational speed different from the first rotational speed to adjust a thickness of the liquid film of the etchant.

According to another example embodiment of the present disclosure, a method of processing a substrate includes an etchant supplying operation of supplying an etchant to a substrate; a puddle operation of forming a liquid film of the etchant supplied to the substrate in a puddle shape by rotating the substrate at a first rotational speed; a heating operation including heating the substrate in a state in which supply of the etchant is stopped; a thickness adjusting operation of controlling the temperature of the substrate by changing a rotational speed of the substrate to a rotational speed different from the first rotational speed to adjust a thickness of the liquid film of the etchant; and a rinsing liquid supplying operation of removing the liquid film of the etchant on the substrate by supplying a rinsing liquid to the substrate while rotating the substrate at a second rotational speed greater than the first rotational speed, after the thickness adjusting operation.

According to another example embodiment of the present disclosure, an apparatus for processing a substrate includes a support unit for supporting and rotating a substrate in a process chamber; an etchant supply unit for supplying an etchant to the substrate; a rotation driving unit for rotationally driving the support unit to form a liquid film of the etchant on the substrate in a puddle shape by rotating the substrate at a first rotational speed; a heating unit for heating the substrate; and a control unit connected to the etchant supply unit, the rotation driving unit, and the heating unit and controlling a rotational speed and a temperature of the substrate to adjust a thickness of the liquid film of the etchant.

BRIEF DESCRIPTION OF DRAWINGS

The above and other aspects, features, and advantages of the present disclosure will be more clearly understood from the following detailed description, taken in conjunction with the accompanying drawings, in which:

FIG. 1 is a diagram illustrating an apparatus for processing a substrate according to an example embodiment of the present disclosure;

FIG. 2 is graphs illustrating an etching rate according to a thickness of a phosphoric acid ($H_3PO_4$) liquid film on a substrate for each temperature when phosphoric acid is used as an etchant according to an example embodiment of the present disclosure;

FIG. 3 is graphs illustrating changes in thickness of a liquid film on a substrate depending on each rotational speed and each position when phosphoric acid is used as an etchant according to an example embodiment of the present disclosure;

FIG. 4 is graphs illustrating a liquid film thickness and etching degree of an etchant on a substrate depending on a rotational speed of the substrate according to an example embodiment of the present disclosure;

FIGS. 5 to 8 are flowcharts illustrating a method of processing a substrate according to an example embodiment of the present disclosure; and FIG. 9 is a diagram illustrating an apparatus for processing a substrate according to another example embodiment of the present disclosure.

DETAILED DESCRIPTION

Hereinafter, example embodiments of the present disclosure will be described as below with reference to the attached drawings.

In the drawings, same elements will be indicated by same reference numerals. Also, redundant descriptions and detailed descriptions of known functions and elements that may unnecessarily make the gist of the present disclosure obscure will be omitted. In the accompanying drawings, some elements may be exaggerated, omitted or briefly illustrated, and the sizes of the elements do not necessarily reflect the actual sizes of these elements. Also, the terms "upper," "upper portion," "upper surface," "lower," "lower portion," "lower surface," "side surface" are based on the drawings, and may be varied in a direction in which the components are disposed.

In the example embodiments, the term "connected" may not only refer to "directly connected" but also include "indirectly connected" by means of an adhesive layer, or the like. Also, the term. "electrically connected" may include both of the case in which elements are "physically connected" and the case in which elements are "not physically connected." The terms, "include," "comprise," "is configured to," or the like of the description are used to indicate the presence of features, numbers, operations, operations, elements, portions or combination thereof, and do not exclude the possibilities of combination or addition of one or more features, numbers, operations, operations, elements, portions or combination thereof.

An apparatus for processing a substrate in the example embodiment may be an apparatus for processing a substrate, and may be used in various processes such as an etching process, a photo process, and a cleaning process. For example, the apparatus for processing a substrate in the example embodiment may be used in an etching process, and specifically, the apparatus for processing a substrate may process substrate by supplying an etchant to the substrate using an etchant supply unit, and may also be used for other substrate processing processes such as a photo process and a cleaning process.

First Example Embodiment

FIG. 1 is a diagram illustrating an apparatus for processing a substrate according to an example embodiment.

Referring to FIG. 1, the apparatus 100 for processing a substrate in the example embodiment may be used in an etching process during a process of manufacturing a semiconductor and may be used to remove a thin film F formed on a substrate W such as a silicon wafer. For example, a thin film F containing silicon nitride may be formed on the substrate W, and the apparatus 100 for processing a substrate may apply an etchant E such as phosphoric acid ($H_3PO_4$) to the substrate F, and may remove the thin film F using an etching reaction between the thin film F and the etchant E.

The apparatus 100 for processing a substrate in the example embodiment may include a support unit 200, an etchant supply unit 300, a rotation driving unit 400, a heating unit 500, and a control unit 600.

The apparatus 100 for processing a substrate may include a process chamber 110 in which an etching process for removing the thin film F is performed, and the support portion 200, the etchant supply portion 300 and the rotation driving unit 400 may be disposed in the process chamber 110.

The support unit 200 may support and rotate the substrate W in the process chamber 110.

The support portion 200 may include a support head 210 having a substantially circular plate shape and a support pin 220 disposed on the support head 210 and supporting an edge portion of the substrate W. Accordingly, the substrate W may be rotated by driving the rotation driving unit 400 while being supported by the support pins 220 of the support unit 200.

The etchant supply unit 300 may supply the etchant E to the substrate W through a spray nozzle 310 to etch the thin film F on the substrate W. Accordingly, the thin film F on the substrate W may be removed by a chemical reaction with the etchant E supplied to the substrate W.

The etchant E may be heated to a predetermined temperature by performing a heat treatment thereon before being supplied to the substrate W. To the end, the etchant supply unit 300 may include a liquid heating unit 320 for heating the etchant E.

The rotation driving unit 400 may be a driving means for rotationally driving the support unit 200, and by rotationally driving the support unit 200, the substrate W may be rotated at a first rotational speed such that a liquid film of the etchant E may be formed on the substrate W in a puddle shape. Here, the first rotational speed is not limited to any particular example, and any speed at which the liquid film of the etchant E supplied to the substrate W may be formed in a puddle shape by rotating the substrate at a low speed may be used.

The rotation driving unit 400 may be disposed below the support head 210 and may include a driving unit 410 including a motor for providing rotational force to the support head 210 of the support unit 200 and a driving shaft 420 connected to the driving unit 410 and the support head 210.

The heating unit 500 may be configured to heat the substrate to reach a reaction temperature range of the etchant supplied to the substrate E and the thin film F on the substrate W.

Further, the chemical reaction between the etchant E and the thin film F on the substrate W may change a reaction rate by the temperature of the etchant E, and to increase the etching rate of the thin film F on the substrate W, the etchant E may be heated. Specifically, the etchant E may be heated to a predetermined temperature through the liquid heating unit 320 of the etchant supply unit 300. For example, when the etchant E is phosphoric acid, it may be heated to about 150° C.-160° C. Also, after the etchant E is supplied to the substrate W, the substrate W may be heated through the heating unit 500 such that the reaction may be performed while maintaining a predetermined temperature range. The heating unit 500 may include a lower heating unit 510 disposed on the support unit 200 and heating the lower portion of the substrate W. The lower heating unit 510 may first preheat the substrate W below the discharge temperature of the etchant E before supplying the etchant E to the substrate W. Specifically, before the etchant E heated by the liquid heating unit 320 of the etchant supply unit 300 is supplied to the substrate W, the substrate W may be preheated first to a temperature lower than or equal to the temperature of the heated etchant E. Accordingly, when the etchant E is supplied to the substrate W, a temperature difference with the substrate W may be reduced, thereby effectively reducing energy loss. Further, after the etchant E is supplied to the substrate W, the substrate W is rotated at the first rotational speed, and the liquid film of the etchant E is formed in a puddle shape, the substrate W may be heated secondarily to a temperature equal to or higher than the discharge temperature of the etchant E through the lower heating unit 510 in a state in which the supply of the etchant E is stopped. Specifically, the substrate W may be heated secondarily to a temperature (e.g., 160° C. or higher, as a specific example, 210° C.±10° C.) higher than the discharge temperature of the heated etchant E through the lower heating unit 510, thereby initiating an etching reaction between the etchant E and the thin film F on the substrate W and improving the etching rate.

However, but an example embodiment thereof is not limited thereto and may be implemented in various manners. For example, the substrate may be heated through a heating unit while or after the liquid film of the etchant supplied to the substrate is formed in a puddle shape without preheating before the etchant is supplied to the substrate. This may address the issues in which, due to the cooling effect of the etchant according to the method of heating the substrate in the process of continuously discharging the etchant, a great deal of energy may be necessary to maintain the temperature of the substrate and there may be a difficulty in maintaining the temperature. Accordingly, an energy saving effect on the amount of consumption and heating of the etchant may be implemented.

The lower heating unit 510 may include a heating lamp 511, for example an infrared lamp. The laser beam output by the lower heating unit 510 may pass through the upper surface of the support head 210 and may be irradiated to the substrate W, thereby heating the substrate W.

Further, for precise control of the temperature of the substrate, the heating unit 500 may further include an upper heating unit 520 disposed above the substrate W. The upper heating unit 520 may be a laser irradiation unit, may be disposed above the central region of the substrate W, and may provide a first laser beam having a circular beam pattern corresponding to a central region of the substrate W and a second laser beam having a circular ring-shaped beam pattern corresponding to a peripheral portion (or an edge portion) surrounding the central portion of the substrate W. As an example, power control of the first laser beam and the second laser beam may be implemented. Specifically, the temperature of the etchant E and the substrate W may be changed in the central portion and peripheral portion (or edge portion) of the substrate W by supplying the etchant E, the temperature difference between the central portion and the peripheral portion may be reduced by adjusting the power of the first laser beam and the second laser beam in the upper heating unit 520, and more precise temperature control may be be implemented for each position of the substrate through the lower heating unit 510 and the upper heating unit 520.

The upper heating unit is not limited thereto, and may be a spot heater for being heated in a spot shape.

Also, the apparatus 100 for processing a substrate may include a bowl portion B configured to surround the substrate W to recover the etchant E. For example, after the etching process is performed, to remove reaction by-products and residual etchant E formed on the substrate W during the reaction, the rotation driving unit 400 may rotate the substrate W at a rotational speed higher than the first rotational speed, and accordingly, reaction by-products and residual etchant E may be removed from the substrate W by centrifugal force. The reaction by-products and residual etchant E removed from the substrate W may be recovered by the bowl portion B and may be discharged to the outside of the apparatus for processing a substrate through a pipe (not illustrated) connected to the bowl portion B.

The control unit 600 may be connected to the etchant supply unit 300, the rotation driving unit 400 and the heating unit 500. The control unit 600 may control the etchant supply unit 300 to supply a predetermined amount of the etchant E to the substrate W, and may be connected to the liquid heating unit 320 of the etchant supply unit 300 and may control the operation of the liquid heating unit 320. Also, the control unit 600 may control the rotation driving unit 400 and the heating unit 500 to adjust the rotational speed and temperature of the substrate W, thereby adjusting the thickness of the liquid film of the etchant E.

The control unit 600 may control the heating unit 500 to heat the substrate W above the discharge temperature of the etchant E after the etchant E heated by the liquid heating unit 320 is supplied to the substrate W, but an example embodiment thereof is not limited thereto, and the substrate may be heated before supplying the etchant, or the substrate may be heated by operating the heating unit in the process of supplying the etchant.

Also, since the controller 600 may control the heating unit 500 to intermittently heat the substrate W, consumption of the etchant E compared to continuous discharge of the etchant E may be reduced.

Accordingly, the control unit 600 in the example embodiment may adjust the thickness of the liquid film of the etchant E by controlling the rotational speed of the substrate W under specific etching conditions, and may also adjust the degree of etching by controlling the temperature of the substrate, thereby adjusting the thickness of the liquid film.

To precisely control the thickness of the liquid film of the etchant E, the apparatus 100 for processing a substrate in the example embodiment may include a thickness measuring unit 700 and a temperature measuring unit 800. The thickness measuring unit 700 may measure the thickness of the liquid film of the etchant E, and the temperature measuring unit 800 may measure the temperature of the substrate W. The control unit 600 may be connected to the thickness measuring unit 700 and the temperature measuring unit 800, and may adjust the rotational speed and temperature of the substrate by controlling the rotation driving unit 400 and the heating unit 500 based on the data measured by the thickness measuring unit 700 and the data measured by the temperature measuring unit 800.

The thickness measuring unit 700 may measure the thickness of the liquid film of the etchant E while the thin film F is being etched using reaction between the thin film F on the substrate W and the etchant E, such that changes in thickness of the liquid film of the etchant E on the substrate W may be detected.

As an example, the thickness measuring unit 700 may be disposed above the substrate W, and may include, although not illustrated, a light emitting unit for irradiating light to the substrate W and a light receiving unit for receiving light refracted by the liquid film and reflected from the substrate W.

The control unit 600 may adjust the rotational speed of the substrate by controlling the rotation driving unit 400 according to a change in the thickness of the liquid film of the etchant E on the substrate W detected by the thickness measuring unit 700, thereby accurately adjusting the thickness of the liquid film on the substrate. The control unit 600 may stop the rotation of the substrate W or may rotate the substrate W at a speed lower than the first rotational speed in the process of adjusting the thickness of the liquid film of the etchant E on the substrate.

The temperature measuring unit 800 may be a thermal imaging camera disposed above the substrate W and may detect the temperature of the substrate W. Further, the controller 600 may detect the temperature of the central portion of the substrate W and the peripheral portion surrounding the central portion through an image obtained by a thermal imaging camera.

FIG. 2 is graphs illustrating an etching rate (ER) according to a thickness of a phosphoric acid ($H_3PO_4$) liquid film on a substrate for each temperature when phosphoric acid is used as an etchant E according to an example embodiment. Referring to the drawings, it is indicated that the thicker the thickness of the phosphoric acid liquid film at the same temperature, the higher the etching degree may be, and the higher the temperature of the etchant E, the higher the etching degree may be.

FIG. 3 is graphs illustrating changes in thickness of a liquid film on a substrate depending on each rotational speed and each position in which phosphoric acid is used as an etchant according to an example embodiment. Referring to the drawing, it is indicated that the thickness of the edge portion may be relatively thick and the central portion may be relatively thin as the rotational speed of the substrate increases due to centrifugal force.

FIG. 4 is graphs illustrating a liquid film thickness and etching degree (etching amount, E/A) of an etchant on a substrate depending on a rotational speed of the substrate according to an example embodiment. Referring to the drawing, as indicated in the graphs of the thickness of liquid film and etching degree of the etchant E on the substrate W at the rotational speeds of the substrate W, 4 rpm, 5 rpm and 6 rpm, by adjusting the rotational speed of the substrate W, the degree of etching at each position of the substrate W may be adjusted.

Accordingly, by appropriately adjusting the rotational speed and temperature of the substrate, the etching may be uniformly performed over the entire surface of the substrate, and also, in an example embodiment, the etching of the central portion, the peripheral portion, or the edge portion of the substrate W may be non-uniformly performed, such that the etching of the substrate may be precisely controlled.

As described above, in an example embodiment, the etching process for the thin film F on the substrate W may be performed by a puddle method to reduce the amount of etchant E. Specifically, the etchant supply unit 300 may supply a predetermined amount of the etchant E to the central portion of the substrate W, and the rotation driving unit 400 may rotate the substrate W at a first rotational speed such that the etchant E may be diffused on the upper surface of the substrate W and may form a liquid film having a predetermined thickness. That is, the etchant E supplied to the substrate W may be diffused from the central portion to the edge portion of the substrate W by centrifugal force, and the etchant E may be sufficiently diffused to the edge portion of the substrate W, and a liquid film may be formed in a puddle shape having a predetermined thickness by the surface tension of the etchant E. After the liquid film of the etchant E is formed on the substrate, the etching process for the thin film F may be performed with the etchant E for a predetermined period of time. The control unit 600 may supply the etchant E heated by the liquid heating unit 320 to the substrate W, and may control the heating unit 500 to heat the substrate W above the discharge temperature of the etchant E. While the chemical reaction between the thin film on the substrate and the liquid film of the etchant E occurs, the control unit 600 may adjust the thickness of the liquid film of the etchant E for each position on the substrate W in real time based on data on the change in thickness of the liquid film of the etchant E on the substrate W detected by the thickness measuring unit 700 and based data on the temperature of the substrate W detected by the temperature measuring unit 800, such that dispersion of the etching rate may be effectively controlled.

For example, when the degree of etching in the central portion of the substrate W is more performed than the degree of etching in the peripheral portion (or edge portion), the control unit 600 may increase the rotational speed of the substrate W, may decrease the temperature of the central portion of the substrate W or may increase the temperature of the peripheral portion (or edge portion) of the substrate W. Also, the rotational speed of the substrate W may be controlled to be higher, and simultaneously, the temperature of the central portion of the substrate W may be controlled to be lowered or the temperature of the peripheral portion (or edge portion) of the substrate W may be controlled to increase, the effect of uniform etching on the substrate W may be implemented.

Also, when the degree of etching in the central portion of the substrate W is less than the degree of etching in the peripheral portion (or edge portion), the control unit 600 may control the rotational speed of the substrate W to be decreased, to increase the temperature of the central portion of the substrate W or to decrease the temperature of the peripheral portion (or edge portion) of the substrate W. Also, the rotational speed of the substrate W may be controlled to be decreased, and simultaneously, the temperature of the central portion of the substrate W may be controlled to be increased or the temperature of the peripheral portion (or edge portion) of the substrate W may be controlled to be lowered, such that the effect of uniform etching on the substrate W may be implemented.

Further, in addition to the implementation of the effect of uniform etching on the substrate W, the degree of etching of a designated portion of the substrate W may be adjusted by controlling the rotational speed and temperature of the substrate W based on the temperature of the substrate W and the change in the thickness of the liquid film of the etchant E on the substrate W, such that dispersion of the etching rate may be effectively controlled.

FIGS. 5 to 8 are flowcharts illustrating a method of processing a substrate according to an example embodiment.

Referring to FIGS. 1 and 5 to 8, a method of processing a substrate of an apparatus for processing a substrate according to an example embodiment will be described in greater detail.

Referring to the drawing, the method of processing a substrate using the apparatus for processing a substrate in the example embodiment may include an etchant supplying operation (S100), a puddle operation (S200), and a thickness adjusting operation (S300).

In the etchant supplying operation (S100), the etchant E may be supplied to the substrate W.

In the etchant supplying operation (S100), the heated etchant E may be supplied to the substrate W through the liquid heating unit 320 of the etchant supply unit 300 while the substrate W is rotated.

In the puddle operation (S200), a liquid film of the etchant E supplied to the substrate W may be formed in a puddle shape by rotating the substrate W at a first rotational speed. In the puddle operation (S200), the control unit 600 may control the rotation driving unit 400 to rotate the substrate W at a first rotational speed reduced from the rotational speed of the substrate W in the etchant supply operation (S100), for example, rpm or less than 15 rpm. Here, the rotational speed of the substrate W in the etchant supplying operation (S100) may be higher than the first rotational speed of the substrate W in the puddle operation (S200), for example, 10-20 rpm, but an example embodiment thereof is not limited thereto, and the rotational speed of the substrate W in the etchant supplying operation (S100) may be appropriately controlled according to the actual situation. Although the first rotational speed is not limited to any particular example, any speed at which the liquid film of the etchant E supplied to the substrate W may be formed in a puddle shape by rotating the substrate W at a low speed may be used. For example, the liquid film of the etchant E supplied to the substrate W may be formed in a puddle shape by rotating the substrate W at a first rotational speed of 15 rpm.

Specifically, referring to FIG. 6, the puddle operation (S200) may include a puddle forming operation (S210) and a stabilization operation (S220). In the puddle forming operation (S210), a liquid film of the etchant E supplied to the substrate W may be formed in a puddle shape by rotating the substrate W at a first rotational speed. In the stabilization operation (S220), the liquid film of the etchant E may be stabilized. For example, in the puddle forming operation (S210), a liquid film of the etchant E supplied to the substrate W may be formed in a puddle shape by rotating the substrate W at 15 rpm or less than 15 rpm as the first rotational speed, and in the stabilization operation (S220), the liquid film of the etchant E may be stabilized at the same speed as the first rotation speed or at a rotation speed of less than 15 rpm, such as 10 rpm.

In the thickness adjusting operation (S300), in a state in which a puddle flat liquid film is formed on the substrate W, the rotational speed of the substrate W may be changed to a rotational speed different from the first rotational speed to adjust the thickness of the liquid film of the etchant E.

Also, in the thickness adjusting operation (S300), the temperature of the substrate may be controlled in the process of controlling the rotational speed of the substrate to adjust the thickness of the liquid film of the etchant E.

Specifically, in the thickness adjustment operation (S300), the control unit 600 may adjust the thickness of the liquid film of the etchant E by controlling the rotational speed and temperature of the substrate W together through the rotation driving unit 400 and the heating unit 500. Specifically, in the thickness adjusting operation (S300), the thickness of the liquid film of the etchant E may be adjusted for each position with respect to the substrate W.

In the thickness adjusting operation (S300), the substrate W may be stopped from rotating or may be rotated at less than the first rotational speed.

To control the temperature of the substrate W, referring to FIG. 7, the method of processing a substrate using the apparatus for processing a substrate in the example embodiment may further include a heating operation (S400) of heating the substrate W within a predetermined temperature range.

The heating operation (S400) may be performed in the puddle operation (S200) and the thickness adjusting operation (S300), and may include a operation of heating the substrate W to a temperature higher than the temperature of the etchant E in a state in which the supply of the etchant (E) is stopped.

Referring to FIG. 8, a first heating operation (S410) and a second heating operation (S420) may be included. In the first heating operation (S410), before the etchant supplying operation (S100), the substrate W may be preheated within a first temperature range. Here, the first temperature range is not limited to any particular example, but as an example, the first temperature range may be equal to or less than the discharge temperature of the etchant E heated to the substrate W. Specifically, before the etchant supplying operation (S100) in which the etchant E heated through the liquid heating unit 320 of the etchant supply unit 300 is supplied to the substrate W, the first heating operation (S410) may be performed such that the substrate W may be primarily preheated to have a temperature lower than or equal to the discharge temperature of the etchant E to be supplied. Accordingly, when the etchant E is supplied to the substrate W, a temperature difference with the substrate W may be reduced, thereby effectively reducing energy loss.

In the second heating operation (S420), in a state in which the supply of the etchant E is stopped in the puddle operation (S200) and the thickness adjusting operation (S300), the substrate W may be heated secondarily within a second temperature range higher than the first temperature range. Specifically, the substrate W may be heated secondarily to a temperature equal to or higher than the discharge temperature of the etchant E through the heating unit 500. Specifically, the substrate W may be heated to a temperature (e.g., 160° C. or higher, as a specific example, 210° C.±10° C.) equal to or higher than the discharge temperature of the etchant E through the lower heating unit 510 and/or the upper heating unit 520, an etching reaction between the etchant E and the thin film F on the substrate W may be initiated and the etching rate may improve.

Also, in the heating operation (S400), the temperature of the central portion of the substrate W and the peripheral portion surrounding the central portion of the substrate W may be adjusted.

The temperature of the substrate W may be intermittently adjusted by performing the heating operation (S400) in the thickness adjusting operation (S300). Specifically, the substrate may be heated by turning on the heating unit 500 for a first predetermined time, and the operation of the heating unit 500 may be turned off for a predetermined second time, such that, by periodically turning on and off the heating unit, the temperature of the substrate W may be maintained within a predetermined range, and also, relatively low energy may be consumed to maintain the temperature of the substrate W, which may be economical, and the effect of energy saving may be implemented.

In the thickness adjusting operation (S300), when the etching degree in the central portion of the substrate W is more performed than the etching degree in the peripheral portion (or edge portion), the controller 600 may control the thickness of the substrate W to be increased, or may control to lower the temperature of the central portion of the substrate W or to increase the temperature of the peripheral portion (or edge portion) of the substrate W. Also, the rotational speed of the substrate W may be controlled to be higher and simultaneously, the temperature of the central portion of the substrate W may be controlled to be lowered or the temperature of the peripheral portion (or edge portion) of the substrate W to be increased, thereby implementing the effect of uniform etching effect on the substrate W.

Also, in the thickness adjusting operation (S300), when the etching degree in the central portion of the substrate W is less than the etching degree in the peripheral portion (or edge portion), the control unit 600 may control the rotational speed of the substrate W to be decreased, or may control the temperature of the central portion of the substrate W to be increased, or may control the temperature of the peripheral portion (or edge portion) of the substrate W to be decreased. Also, the rotational speed of the substrate W may be controlled to be decreased and simultaneously, the temperature of the central portion of the substrate W may be controlled to be increased or the temperature of the peripheral portion (or edge portion) of the substrate W may be controlled to be lowered, thereby implementing the effect of uniform etching effect on the substrate W.

In addition to the implementation of the effect of uniform etching on the substrate, the degree of etching of the designated portion of may be controlled by controlling the rotational speed of the substrate and the temperature of the substrate based on the temperature of the substrate and the thickness of the liquid film of the etchant of the substrate, such that the dispersion of the etching rate may be effectively controlled.

Referring to FIGS. 7 and 8, the method of processing a substrate using the apparatus for processing a substrate in the example embodiment may further include a rinsing liquid supplying operation (S500).

Specifically, after the thickness adjusting operation (S300), in the rinsing liquid supplying operation (S500), the rinsing liquid may be supplied to the substrate W by rotating the substrate W at a second rotational speed greater than the first rotational speed, thereby removing the liquid film of the etchant E on the substrate W. For example, after the etching process is performed, to remove reaction by-products and residual etchant formed in the reaction process on the substrate W, in the rinsing liquid supplying operation (S500), the control unit 600 may supply the rinsing liquid to the substrate by controlling the rotation driving unit 400 to allow the substrate W to rotate at a high second rotational speed determined to be higher than the first rotational speed, for example, 100 rpm or more, such that reaction by-products generated by the chemical reaction between the liquid film of the etchant E on the substrate W and the thin film and the remaining liquid film of the etchant E may be removed from the substrate W by centrifugal force, the substrate W may be cleaned. Although not illustrated in the drawings, the rinsing liquid may be supplied to the substrate through the rinsing liquid supply unit.

Second Example Embodiment

FIG. 9 is a diagram illustrating an apparatus for processing a substrate according to another example embodiment.

An apparatus 100 for processing a substrate according to a second example embodiment in the example embodiment will be described with reference to FIG. 9.

Referring to the drawing, in the apparatus 100 for processing a substrate according to the second example embodiment, the configuration other than the configuration in which the upper heating unit 520 of the heating unit 500 may be movably disposed in the process chamber 110 in the apparatus 100A for processing a substrate may be the same as the example in first example embodiment, and overlapping descriptions will not be provided.

Specifically, the heating unit 500 of the apparatus 100 for processing a substrate may include an upper heating unit 520 movably disposed on the upper portion of the substrate W and locally heating the upper portion of the substrate W.

Specifically, the upper heating unit 520 may be movably disposed on the bottom surface of the process chamber 110 through the heating unit supporting unit 900 above the substrate W. Specifically, the heating unit supporting unit 900 may include a support frame 910 and a lifting member 920 disposed on the support frame 910, connected to the upper heating unit 520 and moving the upper heating unit 520 up and down.

This upper heating unit 520 may be a spot heater. Here, the size of the spot irradiated from the upper heating unit 520 included in the spot heater may correspond to the size of a partial region on the substrate. That is, the upper heating unit 520 may be disposed to be movable in the vertical direction, and may adjust the size of a spot irradiated from the upper heating unit 520 to a portion of the substrate, thereby adjusting the local temperature of the substrate. Also, although the upper heating unit 520 is not illustrated, the upper heating unit 520 may be selectively disposed to be movable in the horizontal direction to adjust the temperature for each position of the substrate, and further, the upper heating unit 520 may be disposed to be rotatably in the horizontal direction.

Accordingly, according to the apparatus for processing a substrate and the method of processing a substrate in the example embodiment, by supplying the etchant and forming a liquid film of the etchant in a puddle shape on the substrate, the consumption of the etchant may be effectively reduced, and the thickness of the liquid film of the etchant on the substrate may be adjusted by appropriately adjusting the rotation speed and temperature of the substrate, the etching may be uniformly performed on the entire surface of the substrate, and also, in an example embodiment, the etching on the central portion, the peripheral portion or the edge portion of the substrate may be non-uniformly performed, such that the etching of the substrate may be precisely controlled, and the dispersion of the etching rate may be effectively controlled.

The apparatus for processing a substrate in the example embodiment may be applied to an etching process, for example, but an example embodiment thereof is not limited thereto, and the apparatus may be used in various processes such as a photo process and a cleaning process. Also, phosphoric acid may be used as an etchant, but an example embodiment thereof is not limited thereto, and various chemical liquids may be used as an etchant if desired. For example, a chemical liquid including hydrogen fluoride may be used as an etchant.

Also, an ultraviolet lamp may be used as a heating unit in the aforementioned example embodiment, but an example embodiment thereof is not limited thereto, and various heating means such as a heater may be used as another example. Further, with respect to the arrangement structure of the heating unit, the aforementioned example embodiment may be used, or if desired, a plurality of heating members corresponding to different positions of the substrate may be disposed and precise heating of the substrate may be performed.

Also, a thermal imaging camera may be used as a temperature measuring unit in the aforementioned example embodiment, but an example embodiment thereof is not limited thereto, and the temperature of the substrate may be measured in various manners, such as a temperature sensor disposed on a support unit or disposed in an appropriate position and detecting the temperature of the substrate.

According to an example embodiment, using the apparatus and the method of processing a substrate according to the example embodiment, by forming a liquid film on the substrate in a puddle shape by supplying the etchant, the consumption of the etchant may be effectively reduced, and by appropriately adjusting the rotational speed of the substrate in the state in which the liquid film is formed on the substrate in a puddle shape, the thickness of the liquid film of the etchant on the substrate may be adjusted, such that etching may be performed uniformly on the entire surface of the substrate, and also, in one example embodiment, etching may be performed non-uniformly in the central portion, the peripheral portion, or the edge portion of the substrate, such that the etching of the substrate may be precisely controlled, and the dispersion of the etching rate may be effectively controlled.

While the example embodiments have been illustrated and described above, it will be apparent to those skilled in the art that modifications and variations could be made without departing from the scope of the present disclosure as defined by the appended claims.

What is claimed is:
1. A method of processing a substrate, the method comprising:
an etchant supplying operation of supplying an etchant to a substrate;

a puddle operation of, by rotating the substrate at a first rotational speed, forming a liquid film of the etchant supplied to the substrate in a puddle shape; and a thickness adjusting operation of changing a rotational speed of the substrate to a rotational speed different from the first rotational speed to adjust a thickness of the liquid film of the etchant, wherein the thickness adjusting operation comprises increasing or decreasing the rotational speed based on temperatures measured at a central portion and a peripheral portion of the substrate and increasing or decreasing temperatures at the central portion or the peripheral portion based on the thickness of the liquid film measured at the central portion and the peripheral portion.

2. The method of claim 1, further comprising:
a heating operation of heating the substrate within a predetermined temperature range.

3. The method of claim 2, wherein the heating operation includes heating the substrate to have a temperature higher than a temperature of the etchant in a state in which supply of the etchant is stopped, which is performed in the puddle operation or the thickness adjusting operation.

4. The method of claim 2, wherein the heating operation includes a first heating operation of pre-heating the substrate within a first temperature range before the etchant supplying operation, and a second heating operation of secondarily heating the substrate within a second temperature range higher than the first temperature range in a state in which supply of the etchant is stopped in the puddle operation and the thickness adjusting operation.

5. The method of claim 2, wherein, in the thickness adjusting operation, a temperature of the substrate is intermittently adjusted by performing the heating operation.

6. The method of claim 2, wherein, in the thickness adjusting operation, each of a temperature of a central portion of the substrate and a temperature a peripheral portion surrounding the central portion of the substrate is adjusted.

7. The method of claim 1, wherein the method further includes, after the thickness adjusting operation, a rinsing liquid supplying operation of supplying a rinsing liquid to the substrate and removing a liquid film of the etchant on the substrate while rotating the substrate at a second rotational speed higher than the first rotational speed.

8. The method of claim 1, wherein the puddle operation includes a puddle forming operation of forming a liquid film of the etchant supplied to the substrate in a puddle shape by rotating the substrate at the first rotational speed and a stabilization operation of stabilizing the liquid film of the etchant.

9. The method of claim 8, wherein, in the thickness adjusting operation, rotation of the substrate is stopped or the substrate may be rotated at a speed less than the first rotational speed.

10. A method of processing a substrate, the method comprising:
an etchant supplying operation of supplying an etchant to a substrate;

a puddle operation of forming a liquid film of the etchant supplied to the substrate in a puddle shape by rotating the substrate at a first rotational speed;

a heating operation including heating the substrate in a state in which supply of the etchant is stopped;

a thickness adjusting operation of controlling the temperature of the substrate by changing a rotational speed of the substrate to a rotational speed different from the first rotational speed to adjust a thickness of the liquid film of the etchant; and a rinsing liquid supplying operation of removing the liquid film of the etchant on the substrate by supplying a rinsing liquid to the substrate while rotating the substrate at a second rotational speed greater than the first rotational speed, after the thickness adjusting operation, wherein the thickness adjusting operation comprises increasing or decreasing the rotational speed based on temperatures measured at a central portion and a peripheral portion of the substrate and increasing or decreasing temperatures at the central portion or the peripheral portion based on the thickness of the liquid film measured at the central portion and the peripheral portion.

11. The method of claim 10, wherein, in the thickness adjusting operation, a temperature of the substrate is intermittently adjusted by performing the heating operation.

12. The method of claim 10, wherein, in the heating operation, each of a temperature of a central portion of the substrate and a temperature a peripheral portion surrounding the central portion of the substrate is adjusted.

13. The method of claim 10, wherein the heating operation is performed in the puddle operation and the thickness adjusting operation.

* * * * *